(12) United States Patent
Tachibana et al.

(10) Patent No.: US 8,696,293 B2
(45) Date of Patent: Apr. 15, 2014

(54) COMPONENT TRANSFER DEVICE AND METHOD

(75) Inventors: Katsuyoshi Tachibana, Tokyo (JP); Soichi Tateno, Tokyo (JP); Toshihito Seki, Tokyo (JP)

(73) Assignee: Hirata Corporation, Tokyo (JP)

( * ) Notice: Subject to any disclaimer, the term of this patent is extended or adjusted under 35 U.S.C. 154(b) by 1070 days.

(21) Appl. No.: 12/674,248

(22) PCT Filed: Aug. 23, 2007

(86) PCT No.: PCT/JP2007/066351
§ 371 (c)(1),
(2), (4) Date: Mar. 9, 2010

(87) PCT Pub. No.: WO2009/025052
PCT Pub. Date: Feb. 26, 2009

(65) Prior Publication Data
US 2010/0202865 A1 Aug. 12, 2010

(51) Int. Cl.
*B65B 21/02* (2006.01)

(52) U.S. Cl.
USPC ........ 414/411; 414/20; 414/280; 414/416.03; 901/12

(58) Field of Classification Search
USPC ......... 414/20, 280, 411, 416.03, 416.07, 589, 414/753.1; 901/12
See application file for complete search history.

(56) References Cited

U.S. PATENT DOCUMENTS

| | | | |
|---|---|---|---|
| 4,764,076 A | * | 8/1988 | Layman et al. ............... 414/217 |
| 5,788,448 A | * | 8/1998 | Wakamori et al. ....... 414/222.02 |
| 5,966,266 A | | 10/1999 | Kato et al. |

FOREIGN PATENT DOCUMENTS

| | | |
|---|---|---|
| JP | 57-111703 | 7/1982 |
| JP | 6-115822 | 4/1994 |
| JP | 9-331191 | 12/1997 |
| JP | 10-12697 | 1/1998 |
| JP | 11-96633 | 4/1999 |
| JP | 2002-19959 | 1/2002 |

OTHER PUBLICATIONS

International Search Report issued Sep. 18, 2007 in International (PCT) Application No. PCT/JP2007/066351.

* cited by examiner

*Primary Examiner* — Saul Rodriguez
*Assistant Examiner* — Willie Berry, Jr.
(74) *Attorney, Agent, or Firm* — Wenderoth, Lind & Ponack, LLP

(57) ABSTRACT

A component transfer device includes a holding mechanism (20) that positions and holds a component on a carrying surface (S) located at a predetermined height and a pull-out unit (40) that pulls out the component held on the carrying surface by the holding mechanism in a horizontal direction. The pull-out unit includes a grasping member (43, 44) that can separably grasp the component from a vertical direction, a cam member (42) that causes the grasping member to perform a component grasping operation and a component releasing operation at predetermined timings by exercising a cam function to the grasping member, a driving mechanism (41, 46, 47) that drives the cam member and the grasping member.

7 Claims, 16 Drawing Sheets

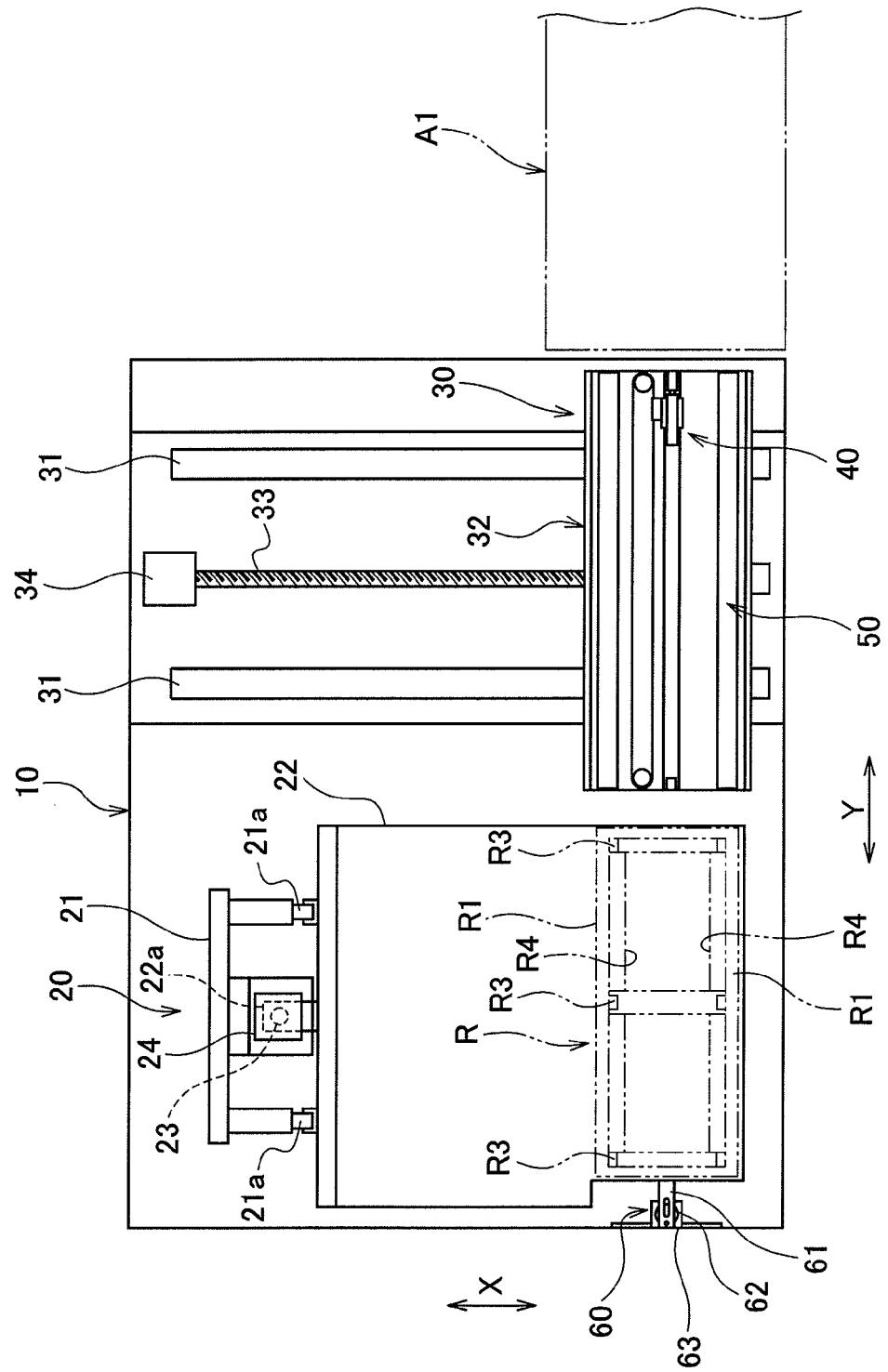

COMPONENT TRANSFER DEVICE AND METHOD

BACKGROUND OF THE INVENTION

1. Technical Field

The present invention relates to a component transfer device and method for taking out a component accommodated in a rack (or a magazine, a cassette, and the like) to be supplied to a supply area, and more particularly to a component transfer device and method for taking out a component having a plate-like shape such as a printed board, a liquid crystal substrate, a glass substrate or a thin-plate tray.

2. Description of the Related Art

As a conventional component transfer device, there is known a substrate supply device that includes a tote box moving means for horizontally and vertically moving a substrate tote box that accommodates printed substrates on a plurality of stages, a substrate fetching means for fetching the printed substrates from the substrate tote box one by one, and others, and that sets the substrate tote box at a predetermined position, moves up and down the same step by step to position each printed substrate at a predetermined fetch position, takes out the printed substrates one by one by using the substrate fetching means, and supplies them to a supply area (e.g., an implementer or an examiner) on a downstream side (see, e.g., Unexamined Japanese Patent Publication No. 9-331191).

In this device, as the substrate fetching means, there are adopted one including an arm portion that causes a protrusion to be caught on an innermost edge portion of a printed substrate from a lower side of the printed substrate and rakes out the printed substrate from the substrate tote box, one having an arm portion that sandwiches a front side of the printed substrate from the vertical direction and pulls out the printed substrate from the substrate tote box, and one including an arm portion that enters from a slit provided on a side surface of the substrate tote box on an opposite side of a fetch direction and pushes out the printed substrate from the substrate tote box.

However, when applying the arm portion that causes the protrusion to be caught on the innermost edge portion of the printed substrate and rakes out the printed substrate as the substrate fetching means in this device, the arm portion must be set to be longer than a length dimension of the substrate (the substrate tote box) in the fetch direction, a size of the device thereby increases, and a driving mechanism for moving up and down the arm portion (the protrusion) is required besides a driving mechanism that reciprocates the arm portion, resulting in complication and increase in size of the device.

Further, when applying the arm portion that operates to push out the printed substrate as the substrate fetching means, the arm portion must be set to be longer than a length dimension of the substrate (the substrate tote box) in a thrusting direction, thereby increasing a size of the device.

Furthermore, when applying the arm portion which sandwiches the front side of the printed substrate from the vertical direction and pulls out the printed substrate as the substrate fetching means, a configuration, a driving mechanism and others that allow this arm portion to perform an operation for sandwiching the printed substrate are not clear, and contents that can be specifically carried out are not disclosed.

SUMMARY OF THE INVENTION

1. Problem to be Solved by the Invention

In view of the above-described situation of the conventional arts, it is an object of the present invention to provide a component transfer device and method that can take out a component such as a substrate accommodated in, e.g., a rack to be smoothly transferred to a predetermined supply area and can improve operation efficiency and productivity while achieving simplification, miniaturization, and a reduction in cost of a configuration.

2. Means for Solving the Problem

A component transfer device according to the present invention that achieves the object includes: a holding mechanism that positions and holds a component on a carrying surface located at a predetermined height; and a pull-out unit that pulls out the component held by the holding mechanism in a horizontal direction, wherein the pull-out unit includes: a grasping member that is capable of separably grasping the component from a vertical direction; a cam member that exercises a cam function with respect to the grasping member to effect a component grasping operation and a component releasing operation at predetermined timings; and a driving mechanism that drives the cam member and the grasping member.

According to this configuration, when the holding mechanism (e.g., a stage or an elevation table on which a component is directly mounted) positions and holds the component on the carrying surface located at a predetermined height, the cam member exercises a cam function based on driving by the driving mechanism in the pull-out unit, and the grasping member vertically grasps (holds) the component in the vertical direction and pull out the component to a predetermined position and then releases the component at predetermined timings.

Since the pull-out unit allows the grasping member to effect the grasping operation and the releasing operation for the component at the predetermined timings in response to the cam function of the cam member, the configuration can be simplified, the component can be assuredly grasped and pulled out at a desired timing, and it can be smoothly transferred to the predetermined supply area as compared with an example using, e.g., a plurality of actuators, thereby improving the operation efficiency and the productivity.

Here, a member that rotates to exercise the cam function or a member that directly reciprocates to exercise the cam function can be applied as the cam member as long as it allows the grasping member to perform the grasping operation and the releasing operation based on the cam function, and a member that is integrally formed to be elastically deformed or a member having different members arranged on an upper side and a lower side thereof can be applied as the grasping member as long as it grasps the component separably in the vertical direction, thus flexibly coping with a conformation and a type of the component.

The device having the above-described configuration can adopt a structure that the holding mechanism includes an elevation unit that moves up and down a rack that accommodates the components on a plurality of stages in the vertical direction, and the pull-out unit pulls out the component positioned on the carrying surface located at the predetermined height by the elevation unit from the rack.

According to this structure, when the elevation unit positions the component in the rack on the carrying surface located at the predetermined height, the cam member exercises the cam function based on driving by the driving mechanism in the pull-out unit, and the grasping member grasps (holds) the component from the vertical direction and pull out the component to the predetermined position, and then releases the component, at the predetermined timings.

As described above, adopting the elevation unit that moves up and down and positions the rack accommodating the components on the plurality of stages enables continuously pulling out and transferring the components.

The device having the above-described configuration can adopt a structure that the cam member exercises the cam function with respect to the grasping member to effect a retracting operation for retracting toward a lower side from the carrying surface.

According to this structure, since the grasping member is retracted from the carrying surface after the grasping member pulls out the component based on the cam function of the cam member, the component can be more smoothly transferred, and the grasping operation, the pull-out operation, the releasing operation, and the retracting operation can be assuredly performed at optimum timings in the mentioned order.

The device having the above-described configuration can adopt a structure that the grasping member includes an upper arm member having an upper contact portion configured to separably come into contact with an upper surface of the component and a lower arm member having a lower contact portion configured to separably come into contact with a lower surface of the component, the cam member includes a guided portion that is guided so as to allow its reciprocation in a pull-out direction of the component, an upper cam portion that exercises a cam function of vertical movement with respect to the upper arm member, and a lower cam portion that exercises the cam function of vertical movement with respect to the lower arm member, and the driving mechanism includes: a movable holder that has a horizontal guide portion that guides the guided portion in a predetermined range in the pull-out direction and a vertical guide portion that guides the upper arm member and the lower arm member in a predetermined range in a vertical direction, and that reciprocates in the pull-out direction; a first stopper that restricts the movement of the cam member alone to exercise the cam function for the grasping operation when the movable holder reaches a predetermined close position close to the rack; and a second stopper that restricts the movement of the cam member alone to exercise the cam function for the releasing operation when the movable holder reaches a predetermined separated position apart from the rack.

According to this structure, the movable holder supports (the guided portion of) the cam member so as to be capable of reciprocating in the predetermined range in the pull-out direction by the horizontal guide portion and also supports the upper arm member that receives the cam function of the upper cam portion and the lower arm member that receives the cam function of the lower cam portion so as to relatively move in the vertical direction by the vertical guide portion.

Further, when the movable holder reaches the close position of the rack and (one side portion) of the cam member comes into contact with the first stopper to be stopped, the movable holder alone further moves, and the upper arm member (the upper contact portion) and the lower arm member (the lower contact portion) grasp the component from the vertical direction based on the cam function of the cam member. On the other hand, when the movable holder moves in an opposite direction to reach the predetermined separated position and (the other side portion of) the cam member comes into contact with the second stopper to be stopped, the movable holder alone further moves, and the upper arm member (the upper contact portion) and the lower arm member (the lower contact portion) release the component based on the cam function of the cam member.

As described above, since the grasping member is formed of the two upper and lower arm members and the relative movement of the cam member with respect to the movable holder generates the cam function, the configuration of the driving mechanism can be simplified, and the grasping operation, the pull-out operation, and the releasing operation can be accurately and smoothly carried out at predetermined timings in the mentioned order.

The device having the above-described configuration can adopt a structure that the cam member is formed so as to exercise the cam function for a retracting operation for retracting the grasping member toward the lower side from the carrying surface when the movable holder further moves in a state that the cam member is in contact with the second stopper to be restricted.

According to this structure, when the movable holder reaches the predetermined separated position and (the other side portion of) the cam member comes into contact with the second stopper to be stopped, the movable holder alone further moves, and the upper arm member (the upper contact portion) and the lower arm member (the lower contact portion) release the component based on the cam function of the cam member and then retract to the lower side from the carrying surface. Since the grasping member is retracted to the lower side of the carrying surface after releasing the component in this manner, the pulled-out component can be smoothly carried (transferred) to the predetermined supply area.

The device having the above-described configuration can adopt a structure that the upper cam portion and the lower cam portion are formed at an upper edge and a lower edge of the cam member, the upper arm member has an upper follower portion that is guided by the vertical guide portion and engages with the upper cam portion, the lower arm member has a lower follower portion that is guided by the vertical guide portion and engages with the lower am portion, and an extension spring that attracts the upper follower portion and the lower follower portion to each other is hooked on them.

According to this structure, the cam member is an end-face cam having the cam portions at the upper edge and the lower edge, the upper follower portion and the lower follower portion are attracted by the extension spring so as to engage with the upper cam portion and the lower cam portion, respectively, and the upper follower portion and the lower following portion also have a function of being guided by the vertical guide portion of the movable holder, thereby obtaining the smooth and assured cam function while achieving, e.g., a reduction in the number of components and simplification of the configuration.

The device having the above-described configuration can adopt a structure including a carrying unit that supports and carries the component pulled out by the pull-out unit.

According to this structure, the carrying unit can transfer the pulled-out component to the supply area on the downstream side at an optimum timing.

The device having the above-described configuration can adopt a structure including a push-out unit that pushes out the component positioned on the carrying surface by a predetermined distance toward the grasping member side.

According to this structure, when the components are arranged at narrow intervals on a plurality of stages, pushing out the component by a predetermined amount in advance by using the push-out unit enables the pull-out unit to assuredly grasp an end region of the pushed-out component. Furthermore, since the push-out unit pushes out the component by a predetermined amount, a long stroke in the conventional technology is no longer necessary, and simplification of the configuration and miniaturization of the device can be achieved.

A component transfer method according to the present invention that achieves the object includes: a holding step of positioning and holding a component on a carrying surface located at a predetermined height; and a pull-out step of pulling out the component positioned and held at the holding step in a horizontal direction, wherein, at the pull-out step, a grasping member is operated based on a cam function of a cam member to grasp the component at a predetermined timing, pulls out the component to a predetermined position while being grasped by the grasping member, and then releases the component.

According to this structure, when the grasping member operates based on the cam function of the cam member, the component positioned on the carrying surface located at the predetermined height at the holding step is grasped (held) from the vertical direction, pulled out to the predetermined position, and then released.

Since the pull-out step includes the grasping operation and the releasing operation carried out based on the cam function of the cam member in this manner, the component can be assuredly grasped and pulled out at a desired timing, and the component can be smoothly transferred to a predetermined supply area, whereby the operation efficiency and the productivity can be improved.

The method having the above-described configuration can adopt a structure that the holding step includes an elevation step of moving up and down a rack accommodating the components on a plurality of stages in a vertical direction, and the component positioned on the carrying surface located at the predetermined height at the elevation step is pulled out from the rack at the pull-out step.

According to this structure, when the grasping member operates based on the cam function of the cam member, the component positioned on the carrying surface located at the predetermined height at the elevation step is grasped (held) from the vertical direction, pulled out to the predetermined position, and then released.

When the elevation step of moving up and down the rack accommodating the components on the plurality of stages is included as the holding step, the components can be continuously pulled out and transferred.

The method having the above-described configuration can adopt a structure that the component is released and then the grasping member is retracted toward a lower side from the carrying surface at the pull-out step.

According to this structure, since the grasping member is retracted from the carrying surface after the grasping member releases the component, the component can be more smoothly transferred.

The method having the above-described configuration can adopt a structure including a carrying step of carrying the component pulled out at the pull-out step toward a downstream side by a carrying unit.

According to this structure, the carrying unit can transfer the pulled-out component to the supply area on the downstream side at an optimum timing.

The method having the above-described configuration can adopt a structure including a push-out step of pushing out the component positioned on the carrying surface by a predetermined distance toward the grasping member side by a push-out unit prior to the pull-out step.

According to this structure, when the components are arranged at narrow intervals on the plurality of stages, pushing out the component by a predetermined amount in advance by using the push-out unit enables assuredly grasping the end region of the pushed-out component.

3. Advantageous Effects of the Invention

According to the component transfer device and method having the above-described configuration, simplification of the structure, miniaturization, a reduction in cost, and others can be achieved, and the component such as a substrate accommodated in, e.g., the rack can be taken out and smoothly transferred to the predetermined supply area, whereby the operation efficiency and the productivity can be improved.

BRIEF DESCRIPTION OF THE DRAWINGS

FIG. 2 is a plan view showing the component transfer device depicted in FIG. 1;

EXPLANATIONS OF LETTERS OR NUMERALS

| | |
|---|---|
| A1 | supply area |
| R | rack |
| W | component |
| Y | pull-out direction |
| Z | vertical direction |
| S | carrying surface located a predetermined height |
| 10 | base |
| 20 | elevation unit (holding mechanism) |
| 21 | support |
| 22 | elevation table |
| 22a | ball nut |
| 23 | ball screw |
| 24 | motor |
| 30 | table unit |
| 31 | guide rail |
| 32 | movable table |
| 32a | ball nut |
| 33 | ball screw |
| 34 | motor |
| 40 | pull-out unit |
| 41 | movable holder (driving mechanism) |
| 41' | two upstanding walls |
| 41" | basal portion |
| 41 | movable holder |
| 41a | guide pin (horizontal guide portion) |
| 41b | vertically long hole (vertical guide portion) |
| 42 | cam member |
| 42a | horizontally long hole (guided portion) |
| 42b | upper cam portion |
| 42c | lower cam portion |
| 42d | one side portion |
| 42e | the other side portion |
| 43 | upper arm member (grasping member) |
| 43a | upper contact portion |
| 43b | upper follower pin (upper follower portion) |
| 43c | vertically long hole |
| 44 | lower arm member (grasping member) |
| 44a | lower contact portion |
| 44b | lower follower pin (lower follower portion) |
| 44c | vertically long hole |
| 45 | holder driving mechanism |
| 45a | guide rail |
| 45b | endless belt |
| 45c | driving pulley |
| 45d | driven pulley |
| 45e | motor |
| 46 | first stopper (driving mechanism) |
| 47 | second stopper (driving mechanism) |
| 48 | extension spring |
| 50 | carrying unit |
| 51 | carrying belt |
| 52 | driven pulley |
| 53 | driving pulley |
| 54 | motor |
| 60 | push-out unit |
| 61 | push-out rod |
| 62 | crank member |
| 63 | motor |

DETAILED DESCRIPTION OF THE INVENTION

Figure 1:
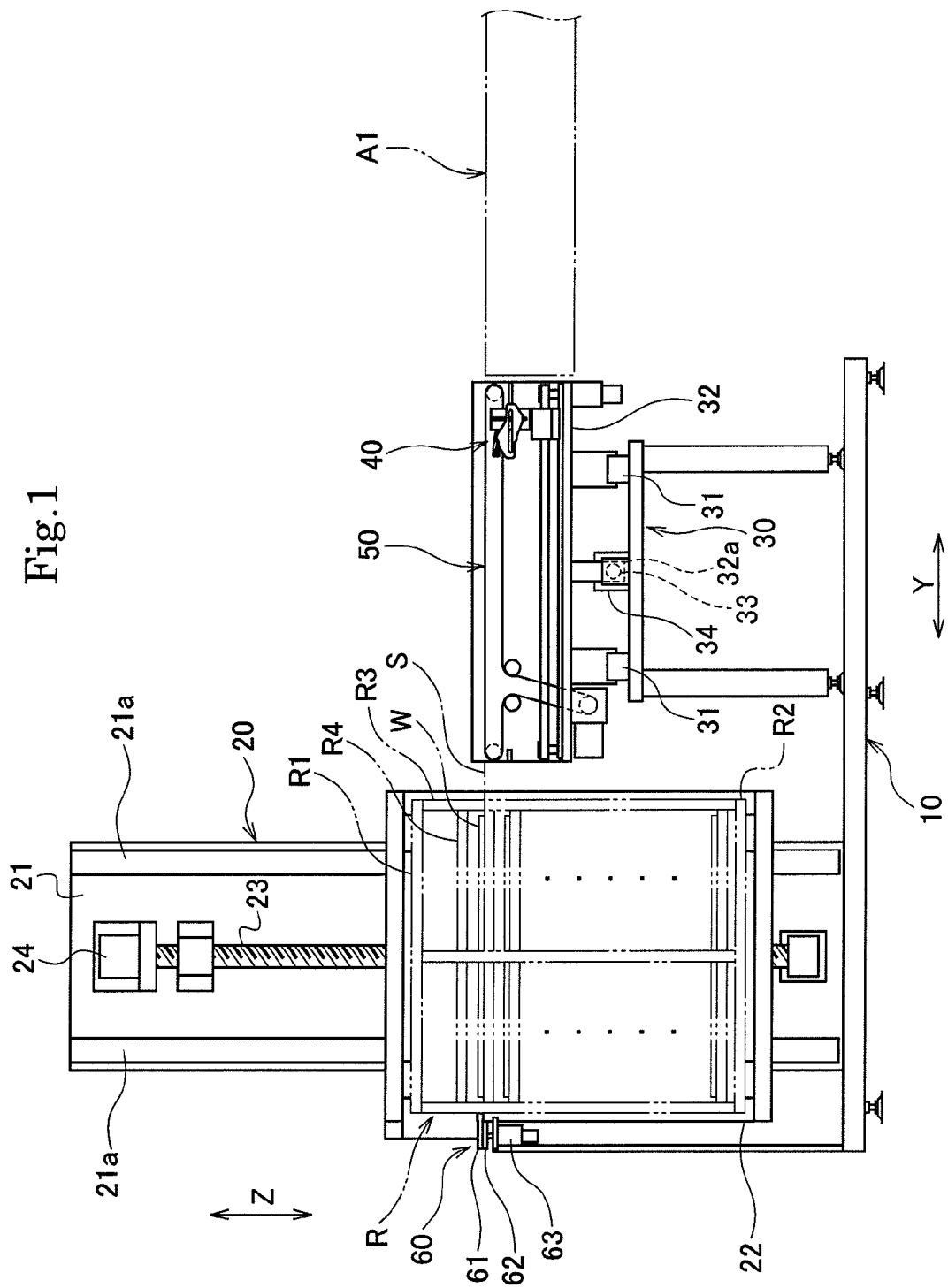
FIG. 1 is a front view showing an embodiment of a component transfer device according to the present invention.

As shown in FIGS. 1 to 3, the component transfer device includes a base 10, an elevation unit 20 as a holding mechanism that moves up and down a rack R that is provided on the left-hand side on the base 10 and accommodates components W therein, a table unit 30 provided on the right-hand side of the base 10, a pull-out unit 40 and a carrying unit 50 that are provided on the table unit 30, a push-out unit 60 that is adjacently provided on the left-hand side of the elevation unit 20 and others.

Further, as shown in FIGS. 1 and 2, a supply area A1 where the component W pulled out from the rack R is supplied is arranged at a position adjacent to the component transfer device in a Y direction.

As shown in FIGS. 1 and 2, the rack R has a substantially rectangular solid outline and includes an upper frame R1, a lower frame R2, vertical frames R3 that connect the upper frame R1 with the lower frame R2 and are provided at four corners and two positions at the center, mount frames R4 which are provided to the vertical frames R3 on a plurality of stages and on which the components W can be mounted, and others so that the substrate-like components W each having a substantially rectangular plate-like shape can be aligned and accommodated along a vertical direction Z.

As shown in FIGS. 1 and 2, the elevation unit 20 includes a support 21 vertically provided on the base 10, an elevation table 22 supported to be capable of moving up and down in the vertical direction Z with respect to guide rails 21a of the support 21, a ball screw 23 that is screwed to a ball nut 22a of the elevation table 22 and extends in a vertical direction Z, a motor 24 that drives the ball screw 23 to rotate, and others.

Further, in the elevation unit 20, when the motor 24 rotates in a state that the rack R is held on the elevation table 22, the ball screw 23 rotates, the elevation table 22 moves up and down step by step together with the ball nut 22a, and the components W to be pulled out are positioned on a carrying surface S located at a predetermined height one by one.

As shown in FIGS. 1 to 3B, the table unit 30 includes guide rails 31 that are fixed on the base 10 and extend in the X direction, a movable table 32 that is guided by the guide rails 31 and moves in the X direction, a ball screw 33 that is screwed to a ball nut 32a of the movable table 32 and extends in the X direction, a motor 34 that drives the ball screw 33 to rotate, and others.

As shown in FIGS. 1 to 3B, a pull-out unit 40 and a carrying unit 50 are provided on the movable table 32.

Furthermore, when the motor 34 rotates, the movable table 32 moves in the X direction through the ball screw 33 and the ball nut 32a to be positioned at a predetermined location.

As shown in FIGS. 3A to 9, the pull-out unit 40 includes a movable holder 41, a cam member 42, an upper arm member 43 and a lower arm member 44 as a grasping member, a holder driving mechanism 45 that drives the movable holder 41, a first stopper 46 with which one side portion of the cam member 42 can come into contact, a second stopper 47 with which the other side portion of the cam member 42 can come into contact, and others.

Here, the movable holder 41, the first stopper 46, the second stopper 47, and others constitute a driving mechanism that drives the cam member 42 and the grasping member (the upper arm member 43 and the lower arm member 44).

As shown in FIGS. 4 to 7, the movable holder 41 is formed so as to define two upstanding walls 41' that stand upright at a predetermined interval in the X direction and a basal portion 41" connected to the holder driving mechanism 45, and the respective upstanding walls 41' are integrally coupled and formed so as to include two guide pins 41a as a horizontal guide portion that guides the cam member 42 to enable its reciprocation in a pull-out direction (a Y direction) of the component W, a vertically long hole 41b as a vertical guide portion that guides the upper arm member 43 and the lower arm member 44 to allow their reciprocation in the vertical direction Z, and others.

As shown in FIGS. 4 to 6 and FIG. 9, the two cam members 42 are arranged at a predetermined interval in the X direction and integrally coupled, and each cam member 42 is formed so as to include a laterally long hole 42a as a guided portion which is extended in the pull-out direction (the Y direction) of the component W and into which the guide pin 41a is inserted, an upper cam portion 42b formed at an upper edge, a lower cam portion 42c formed at a lower edge, one side portion 42d that can come into contact with the first stopper 46, the other side portion 42e that can come into contact with the second stopper 47, and others.

As shown in FIGS. 4 to 6 and FIG. 8A, the upper arm member 43 is formed so as to include an upper contact portion 43a that can separably come into contact with an upper surface of the component W, an upper follower pin 43b as an upper follower portion that engages with the upper cam portion 42b, a vertically long hole 43c into which a later-described lower follower pin 44b of the lower arm member 44 is inserted, and others.

As shown in FIGS. 4 to 6 and FIG. 8B, the lower arm member 44 is formed so as to include a lower contact portion 44a that can separably come into contact with a lower surface of the component W, a lower follower pin 44b as a lower follower portion that engages with the lower cam portion 42c, a vertically long hole 44c into which the upper follower pin 43b of the upper arm member 43 is inserted, and others.

Figure 4:
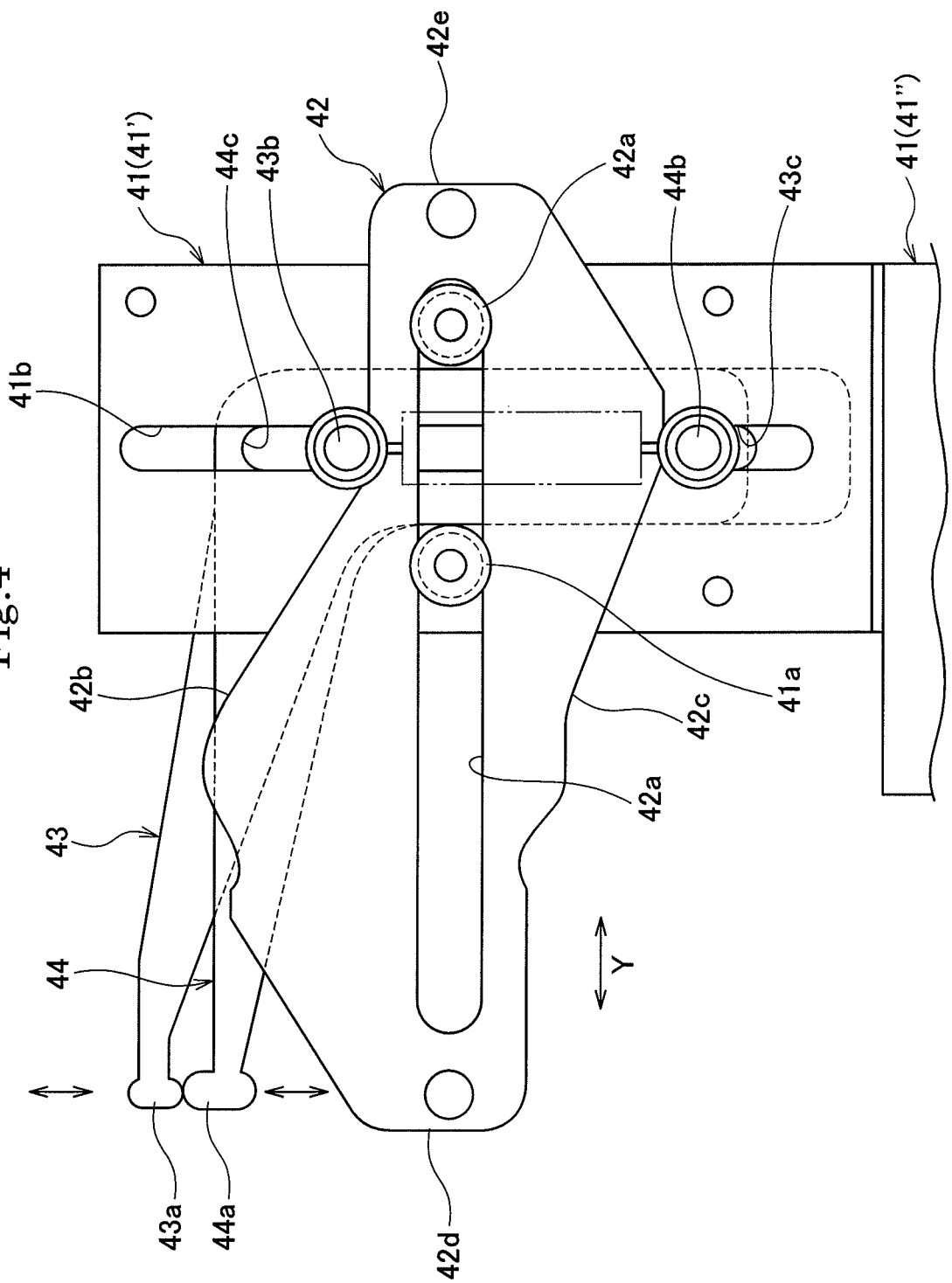
FIG. 4 is a front view showing a cam member, a grasping member (an upper arm member, a lower arm member), and a movable holder that form a part of the component transfer device depicted in FIG. 1.
Figure 5:
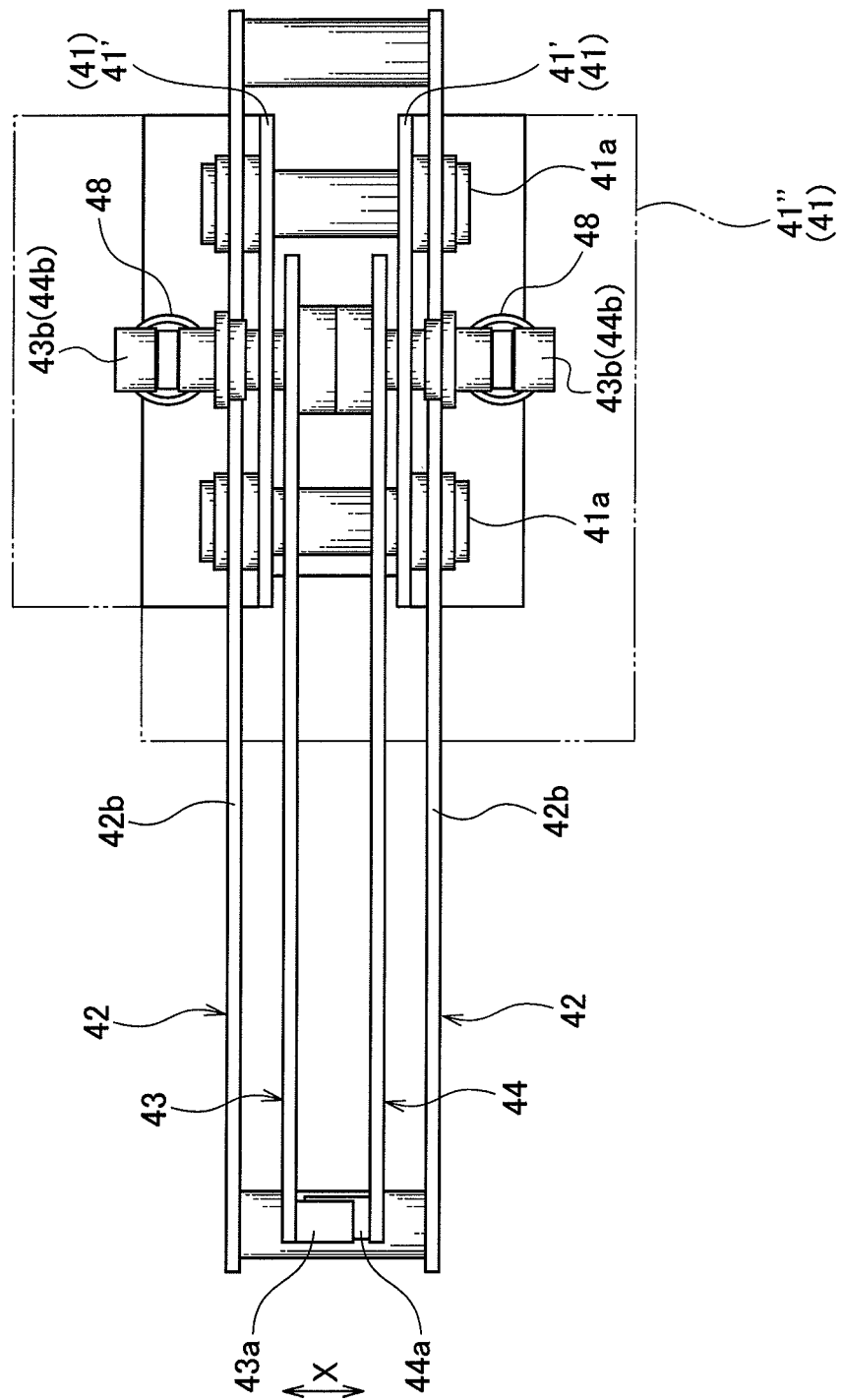
FIG. 5 is a plan view showing the cam member, the grasping member (the upper arm member, the lower arm member), and the movable holder that form a part of the component transfer device depicted in FIG. 1.
Figure 6:
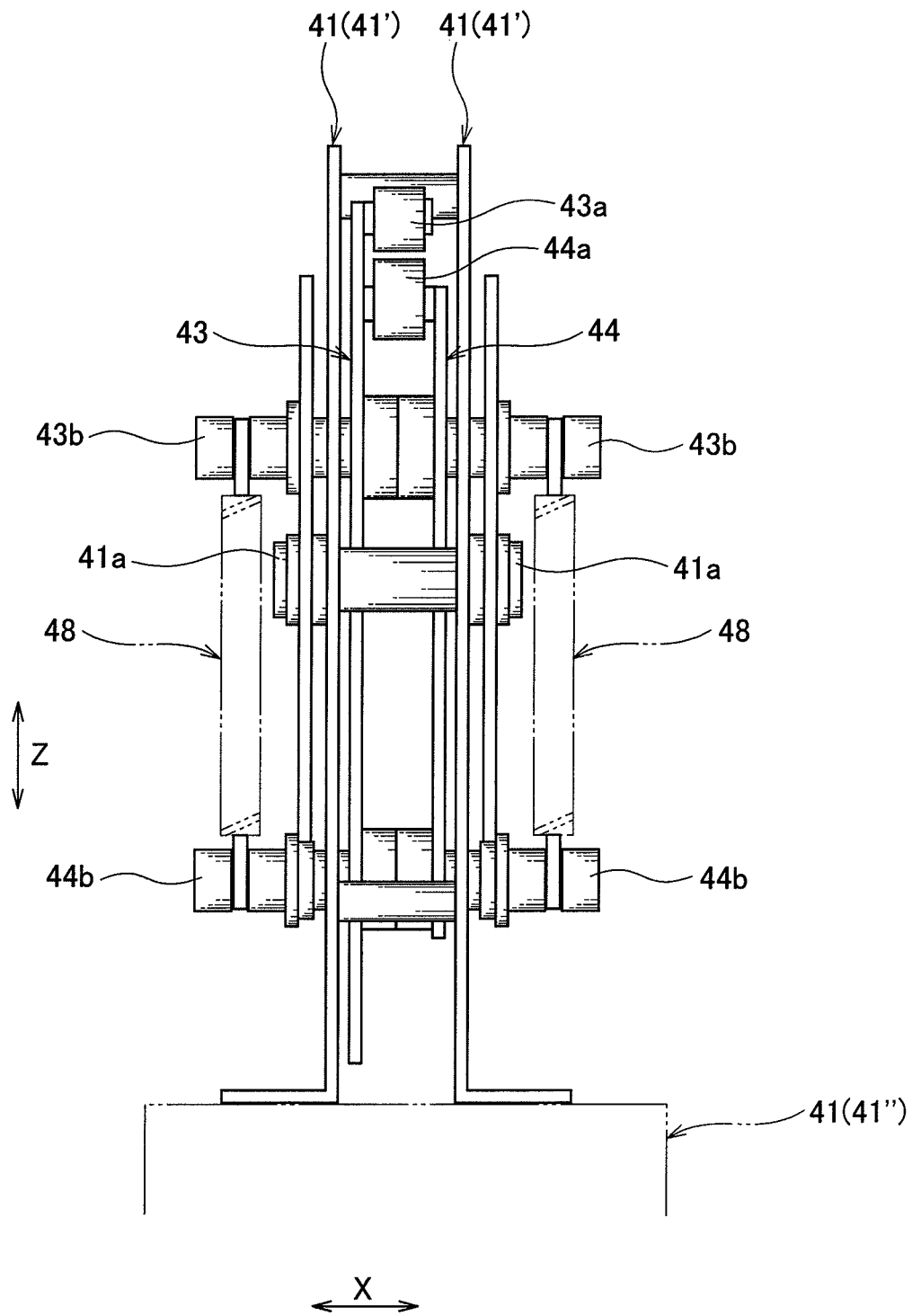
FIG. 6 is a left side view showing the cam member, the grasping member (the upper arm member, the lower arm member), and the movable holder that form a part of the component transfer device depicted in FIG. 1.
Figure 7:
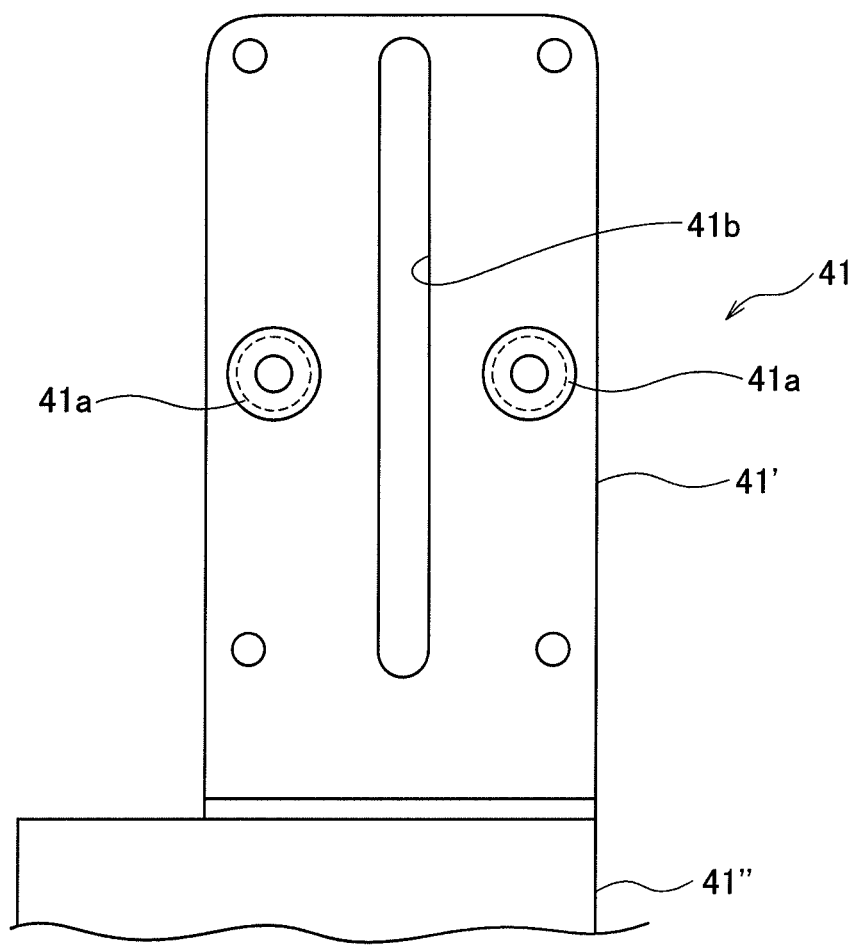
FIG. 7 is a front view showing the movable holder that forms a part of the component transfer device depicted in FIG. 1.
Figure 8A:
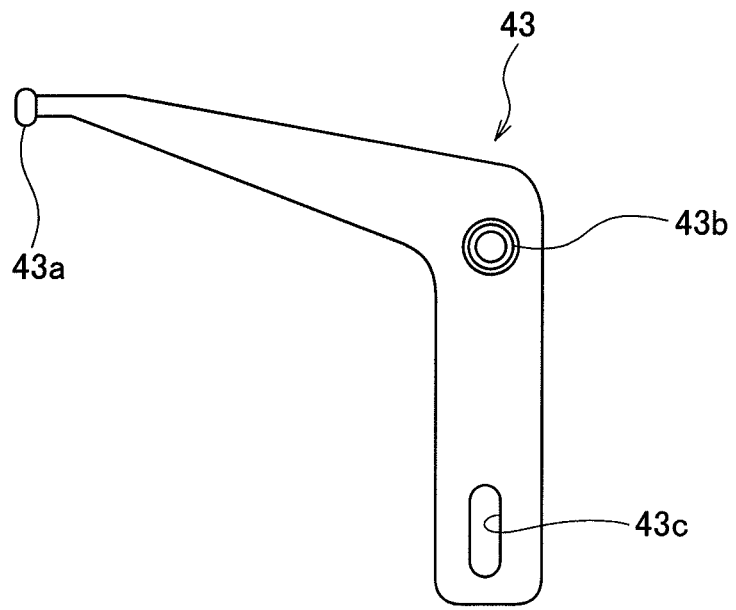
FIG. 8A is a front view showing the upper arm member that forms a part of the component transfer device depicted in FIG. 1.
Figure 8B:
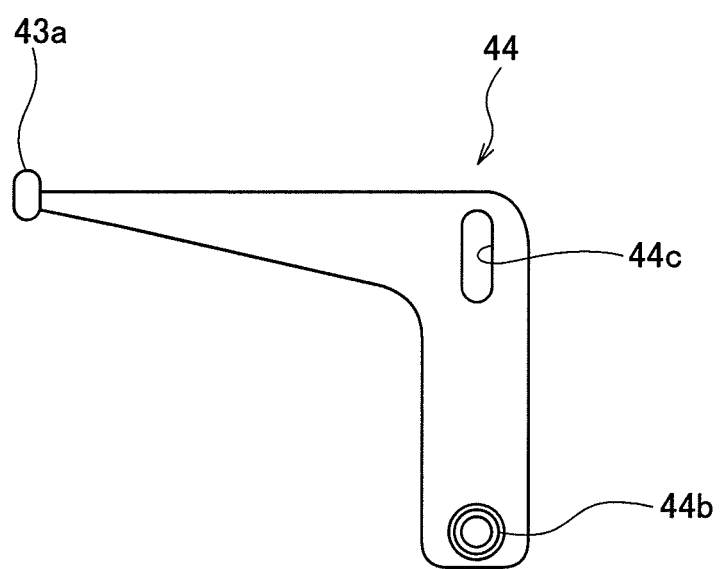
FIG. 8B is a front view showing the lower arm member that forms a part of the component transfer device depicted in FIG. 1.

Moreover, as shown in FIG. 4, the upper follower pin 43b is inserted into the vertically long hole 41b of the movable frame 41 and the vertically long hole 44c of the lower arm member 44 to be guided to allow its reciprocation in the vertical direction Z with respect to the movable holder 41. Additionally, as shown in FIG. 4, the lower follower pin 44b is inserted into the vertically long hole 41b of the movable frame 41 and the vertically long hole 43c of the upper arm member 43 to be guided to allow its reciprocation in the vertical direction Z with respect to the movable holder 41.

Further, an extension spring 48 is hooked on the upper follower pin 43b and the lower follower pin 44b so as to attract these pins toward each other. As a result, the upper follower pin 43b maintains a state that it is engaged with the upper cam portion 42b and receives a cam function of the vertical movement, and the lower follower pin 44b maintains a state that it is engaged with the lower cam portion 42c and receives the cam function of the vertical movement.

That is, in a relationship among the movable holder 41, the cam member 42, the upper arm member 43, and the lower arm member 44, the upper cam portion 42b and the lower cam portion 42c exercise the cam function so as to relatively vertically move the upper arm member 43 and the lower arm member 44.

Figure 9:
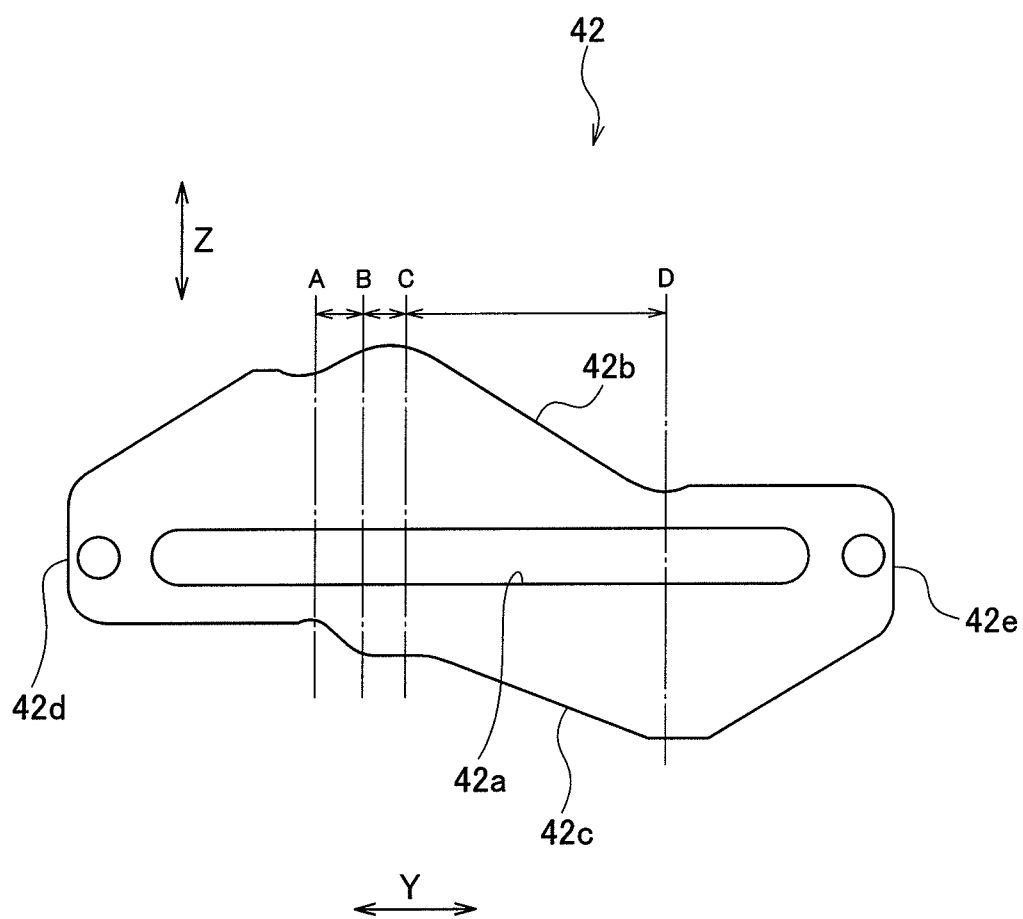
FIG. 9 is a front view showing the cam member that forms a part of the component transfer device depicted in FIG. 1.
Figure 10:
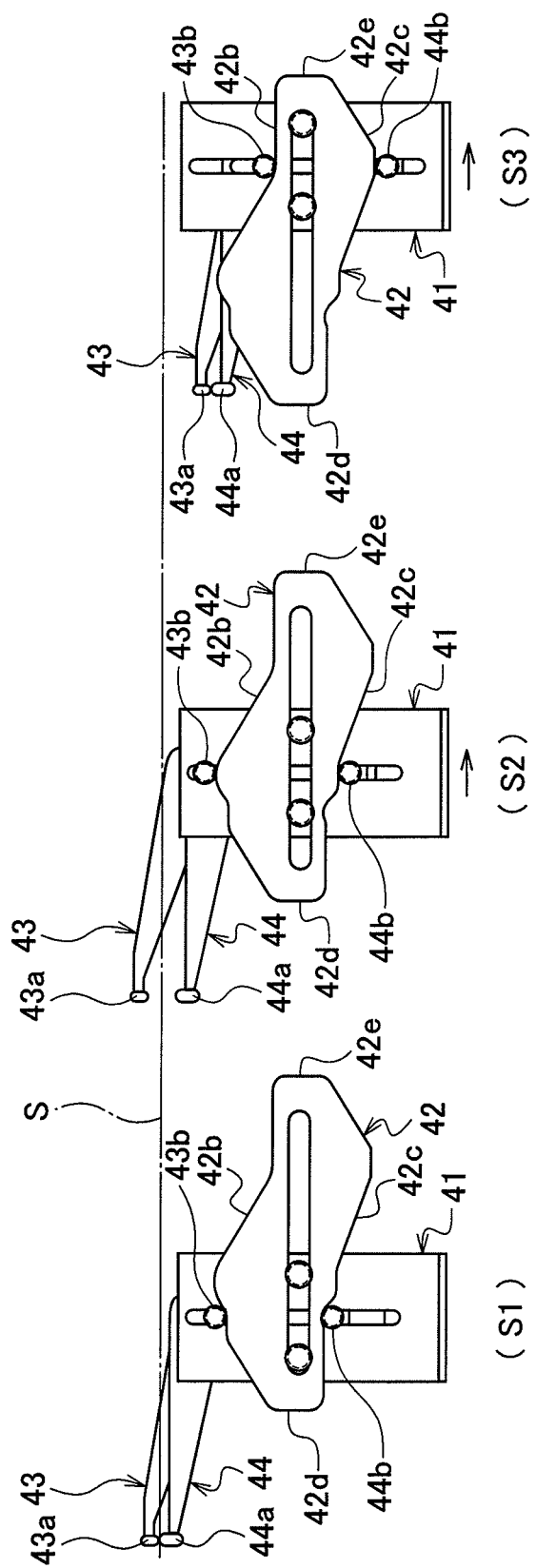
FIG. 10 is an operation view showing operations of the cam member and the grasping member (the upper arm member, the lower arm member) that form a part of the component transfer device depicted in FIG. 1.

As shown in FIGS. 9 and 10, when the upper follower pin 43b and the lower follower pin 44b move from a point A toward a point D (i.e., when the movable holder 41 moves toward the right-hand side in a state that the other side portion 42e of the cam member 42 is in contact with the second stopper 47), a grasping operation (S1 in FIG. 10) and a pull-out operation, a releasing operation (S2 in FIG. 10), and a retracting operation (S3 in FIG. 10) are continuously carried out in the mentioned order.

That is, the upper contact portion 43a and the lower contact portion 44a move closer to each other to grasp the component W from the vertical direction Z as indicated by S1 in FIG. 10 when the upper follower pin 43b and the lower follower pin 44b are placed at the point A, the upper contact portion 43a and the lower contact portion 44a move away from each other to complete an operation for canceling grasp of the component W as indicated by S2 in FIG. 10 when these pins are placed at the point B or pass through the point B, the upper contact portion 43a and the lower contact portion 44a deviate from the component W toward the front side in the pull-out direction Y when these pins are placed at the point C or pass through the point C, and an operation for retracting the upper arm member 43 and the lower arm member 44 toward the lower side from the carrying surface S is completed as indicated by S3 in FIG. 10 when these pins are placed at the point D.

On the other hand, when the upper follower pin 43b and the lower follower pin 44b move toward the point A from the point D (i.e., when the movable holder 41 moves toward the left-hand side in a state that the one side portion 42d of the cam member 42 is in contact with the first stopper 46), an operation of moving up to the height of the carrying surface S from a standby state at a retracted position, receiving an end region of the component W and grasping the component W from the vertical direction Z is completed.

Figure 3A:
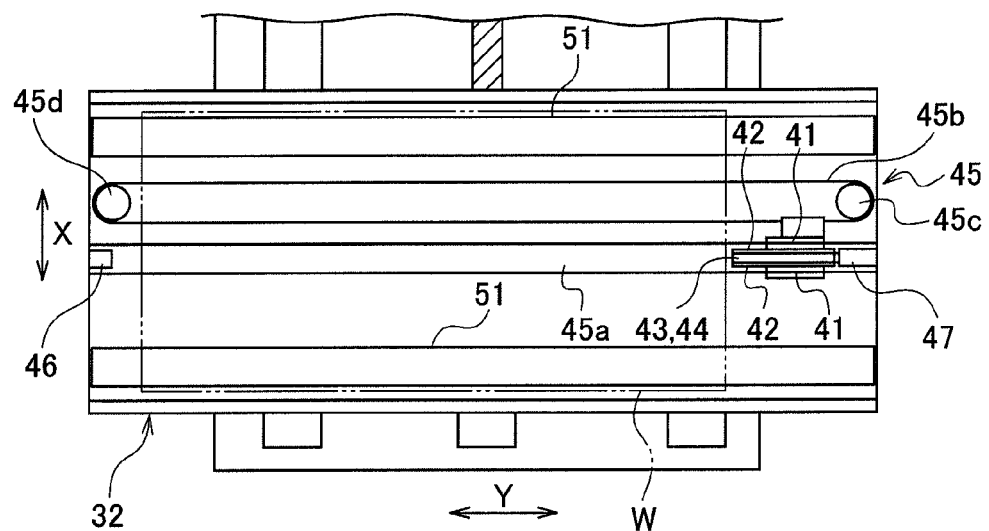
FIG. 3A is a plan view showing a pull-out unit included in the component transfer device depicted in FIG. 1.
Figure 3B:
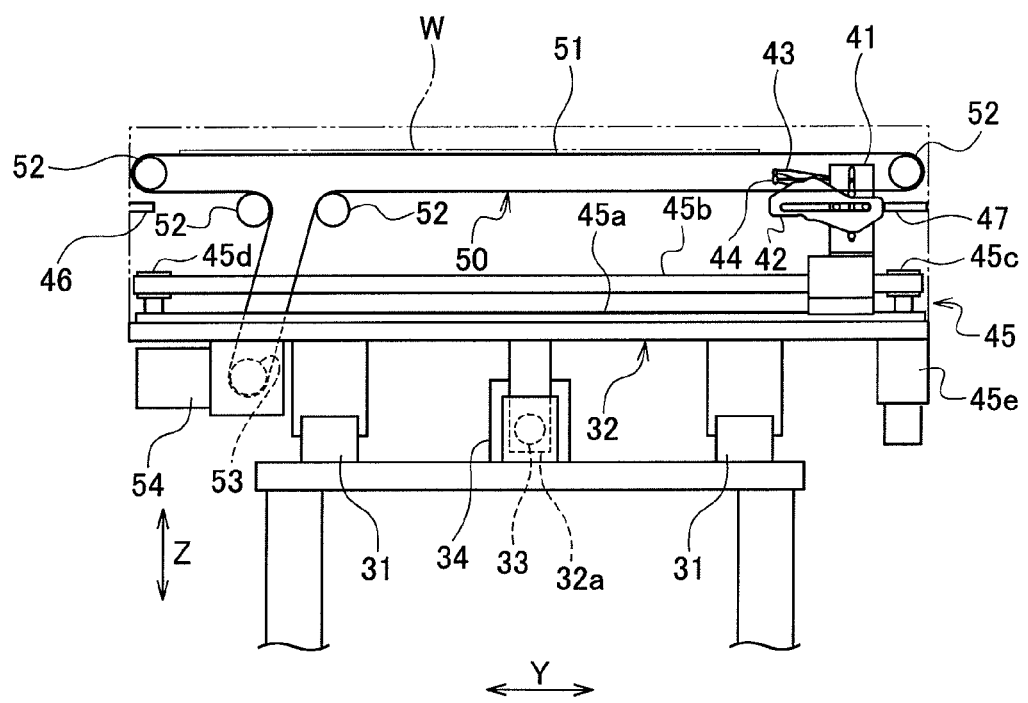
FIG. 3B is a front view showing the pull-out unit included in the component transfer device depicted in FIG. 1.

As shown in FIGS. 3A and 3B, the holder driving mechanism 45 includes a guide rail 45a that is formed to extend in the pull-out direction (the Y direction) on the movable table 32 and guides the movable holder 41 to allow its reciprocation, an endless belt 45b coupled with the movable holder 41 (the basal portion 41″), a driving pulley 45c and a driven pulley 45d around which the endless belt 45b is wound, a motor 45e that drives the driving pulley 45c to rotate, and others.

Further, when the motor 45e rotates in one direction, the movable holder 41 that holds the cam members 42 and the grasping member (the upper arm member 43 and the lower arm member 44) is driven along the guide rail 45a (in the pull-out direction (the Y direction)) in the left direction along which it gets closer to the rack R. On the other hand, when the motor 45e rotates in the other direction, the movable holder 41 that holds the cam members 42 and the grasping member (the upper arm member 43 and the lower arm member 44) is driven along the guide rail 45a (in the pull-out direction (the Y direction)) in the right direction along which it gets away from the rack R.

As shown in FIGS. 3A and 3B, the first stopper 46 is arranged at a left end (a side closer to the rack R) on the movable table 32 in the pull-out direction (the Y direction).

Furthermore, when the movable holder 41 moves toward the left side in the pull-out direction (the Y direction) and reaches a predetermined close position close to the rack R, the first stopper 46 causes the one side portion 42d of the cam member 42 to come into contact therewith and restricts the movement of the cam member 42 alone so as to exercise the cam function for the grasping operation.

As shown in FIGS. 3A and 3B, the second stopper 47 is arranged at a right end (a side apart from the rack R) on the movable table 32 in the pull-out direction (the Y direction).

Moreover, when the movable holder 41 moves toward the right side in the pull-out direction (the Y direction) and reaches a predetermined separated position apart from the rack R, the second stopper 47 causes the other side portion 42e of the cam member 42 to come into contact therewith and restricts the movement of the cam member 42 alone so as to exercise the cam function for the releasing operation.

As described above, since the grasping member (the upper arm member 43 and the lower arm member 44), the cam members 42 which enables the grasping operation and the releasing operation for the component W by exercising the cam function with respect to the grasping member, and the driving mechanism (the movable holder 41, the first stopper 46, the second stopper 47, and others) are adopted as the pull-out unit 40, the component W can be assuredly grasped and pulled out at a desired timing and smoothly transferred to the supply area A1 while achieving simplification of the configuration, thereby improving the operation efficiency and the productivity.

In particular, since the two members, i.e., the upper arm members 43 and the lower arm member 44 are adopted as the grasping member, the grasping operation, the pull-out operation, and the releasing operation can be accurately and smoothly carried out at a predetermined timing in the mentioned order while simplifying the configuration of the driving mechanism.

Additionally, since the cam member 42 is an end-face cam that defines the upper cam portion 42b and the lower cam portion 42c at the upper edge and the lower edge thereof, the shape of the cam member 42 can be simplified, the upper follower pin 43b and the lower follower pin 44b are attracted toward each other by the extension spring 48 so as to engage with the upper cam portion 42b and the lower cam portion 42c, respectively, and each of the upper follower pin 43b and the lower follower pin 44b also has a function of being guided by the vertically long hole 41b of the movable holder 41, thereby obtaining the smooth and assured cam function while achieving a reduction in the number of components, simplification of the configuration, and others.

As shown in FIGS. 3A and 3B, the carrying unit 50 includes endless carrying belts 51 that can support the pulled-out component W, a plurality of driven pulleys 52 around which the carrying belts 51 are wound, a driving pulley 53, a motor 54 that drives the driving pulley 53 to rotate, and others.

Further, when the motor 54 rotates, the pulled-out component W is supported to be carried toward the supply area A1 on the downstream side.

Since the carrying unit 50 that supports and carries the component W pulled out by the pull-out unit 40 is provided in this manner, the pulled-out component W can be transferred to the supply area A1 on the downstream side at an optimum timing.

As shown in FIGS. 1 and 2, the push-out unit 60 includes a push-out rod 61 that comes into contact with an edge portion of the component W, a crank member 62 that reciprocates the push-out rod 61, a motor 63 that drives the crank member 62 to rotate, and others.

The push-out rod 61 is formed at a position on the carrying surface S so as to reciprocate by a predetermined distance in the pull-out direction (the Y direction).

Furthermore, when the motor 63 rotates and the crank member 62 thereby rotates a predetermined angle, the push-out rod 61 enters the rack R to push the component W positioned on the carrying surface S by a predetermined distance toward the grasping member (the upper arm member 43 and the lower arm member 44) or the carrying unit 50 from the rack R.

Since the push-out unit 60 pushes out the component W by the predetermined distance in advance in this manner, the pull-out unit 40 can assuredly grasp the end region of the pushed component W even though the components W are aligned at small intervals on the plurality of stages. Moreover, since the push-out unit 60 pushes out the component W by the predetermined distance, a long stroke like that in the conventional examples is no longer necessary, thereby achieving simplification of the configuration and a reduction in size of the device.

An operation (a transfer method) of the component transfer device will now be described with reference to FIGS. 11 to 16.

Figure 11:
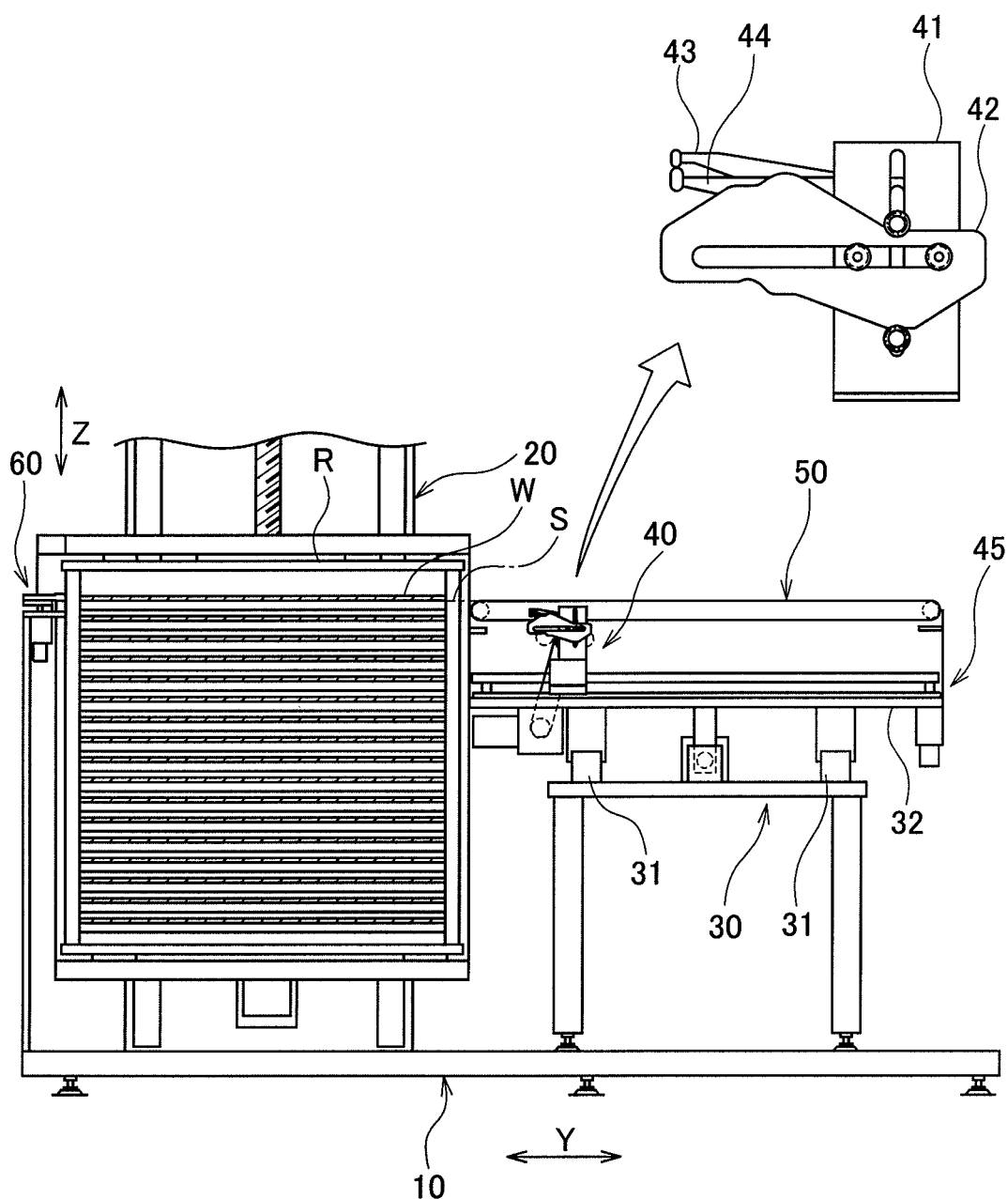
FIG. 11 is an operation view showing an operation for positioning the component on a carrying surface located a predetermined height in the component transfer device according to the present invention.

First, as shown in FIG. 11, when the rack R accommodating the components W on the plurality of stages is carried into and held by the elevation unit 20, the elevation unit 20 moves up and down to position the component W that is to be taken out first on the carrying surface S located at a predetermine height (a holding step, an elevation step). At this moment, the pull-out unit 40 is stopped at a position retracted to the lower side from the carrying surface S in a state that the upper contact portion 43a of the upper arm member 43 and the lower contact portion 44a of the lower arm member 44 are closer to each other.

Figure 12:
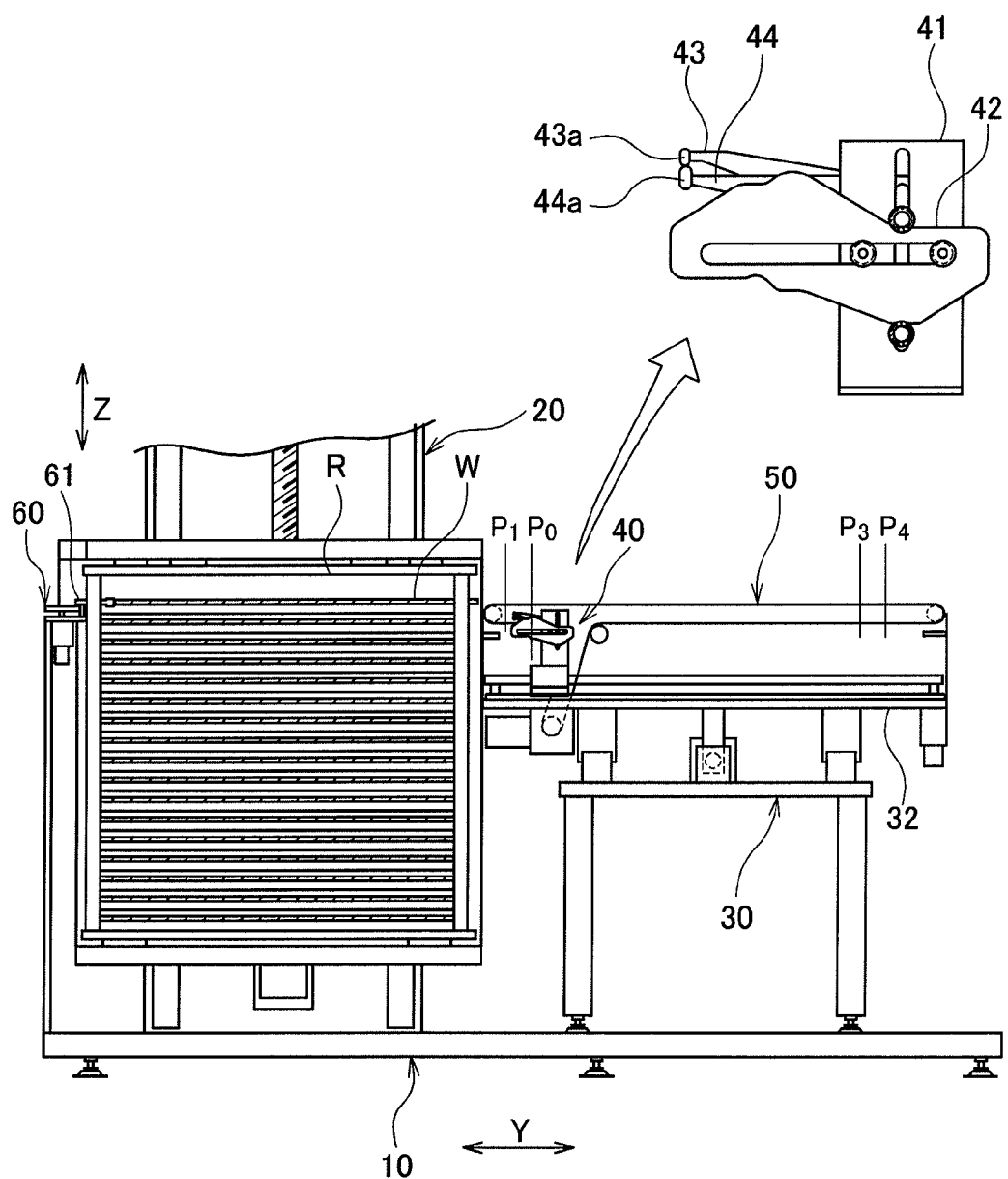
FIG. 12 is an operation view showing operations of a push-out unit and a pull-out unit in the component transfer device according to the present invention.

Subsequently, when the component W positioned on the carrying surface S is detected by, e.g., a sensor (not shown), the push-out unit 60 operates to push out this component W by the predetermined distance toward the right-hand side from the rack R (a push-out step) as shown in FIG. 12. Additionally, the movable holder 41 moves in the left-hand side in the pull-out direction (the Y direction) to reach a standby position $P_0$. Here, when the pull-out unit 40 and the carrying unit 50 deviate from a predetermined position in the X direction, the movable table 31 is appropriately driven in the X direction, thereby correcting this displacement.

Figure 13:
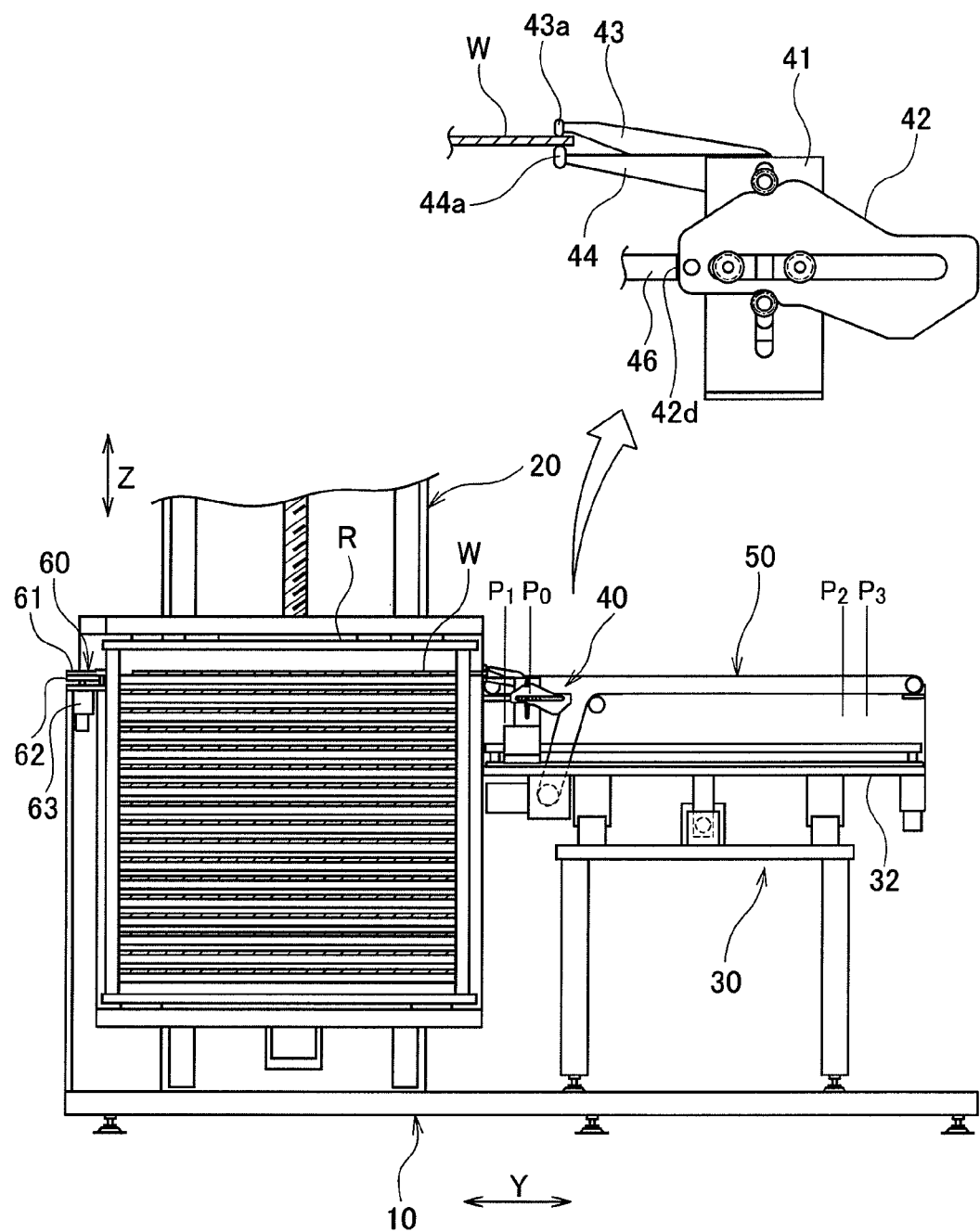
FIG. 13 is an operation view showing an operation for grasping the component by the pull-out unit in the component transfer device according to the present invention.

Subsequently, as shown in FIG. 13, when the push-out operation for the component W performed by the push-out unit 60 is completed, the push-out unit 60 (the push-out rod 61) returns to the standby position. Further, when the movable holder 41 moves toward the left-hand side to reach the close position close to the rack R, the one side portion 42d of the cam member 42 comes into contact with the first stopper 46 to restrict the movement of the cam member 42 toward the left-hand side, and (the upper contact portion 43a of) the upper arm member 43 and (the lower contact portion 44a of) the lower arm member 44 move up a predetermined distance to position (the upper contact portion 43a of) the upper arm member 43 above the carrying surface S and position (the lower contact portion 44a of) the lower arm member 44 below the carrying surface S while the movable holder 41 further moves by a predetermined distance toward the left-hand side to reach a grasping position $P_1$, thereby positioning the component W between the upper contact portion 43a and the lower contact portion 44a while maintaining a state that the upper contact portion 43a is apart from the lower contact portion 44a. And the upper contact portion 43a and the lower contact portion 44a come closer from the vertical direction Z of the component W to grasp the end region of the component W.

Figure 14:
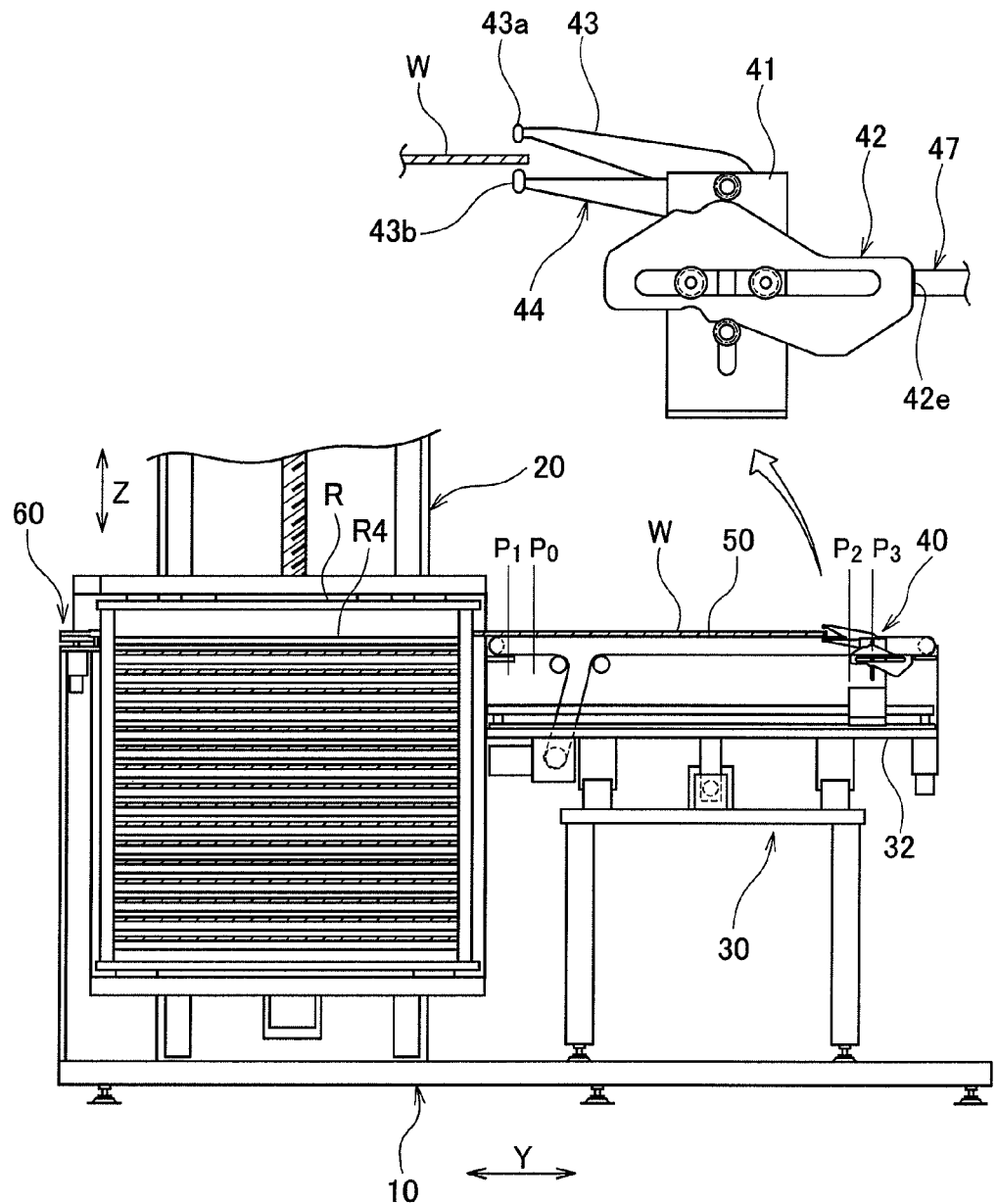
FIG. 14 is an operation view showing an operation for releasing the component after pulling out the component to a predetermined position by the pull-out unit in the component transfer device according to the present invention.

Subsequently, when the movable holder 41 moves toward the right-hand side in the pull-out direction (the Y direction) to reach a separated position apart from the rack R as shown in FIG. 14 in a state that the upper arm member 43 and the lower arm member 44 grasp the component W, the other side portion 42e of the cam member 42 comes into contact with the second stopper 47 to restrict the rightward movement of the cam member 42, and (the upper contact portion 43a of) the upper arm member 43 and (the lower contact portion 44a of) the lower arm member 44 move away from the component W in the vertical direction Z to release the component W while the movable holder 41 further moves rightward by a predetermined distance to reach a release position $P_2$ (the pull-out step).

Figure 15:
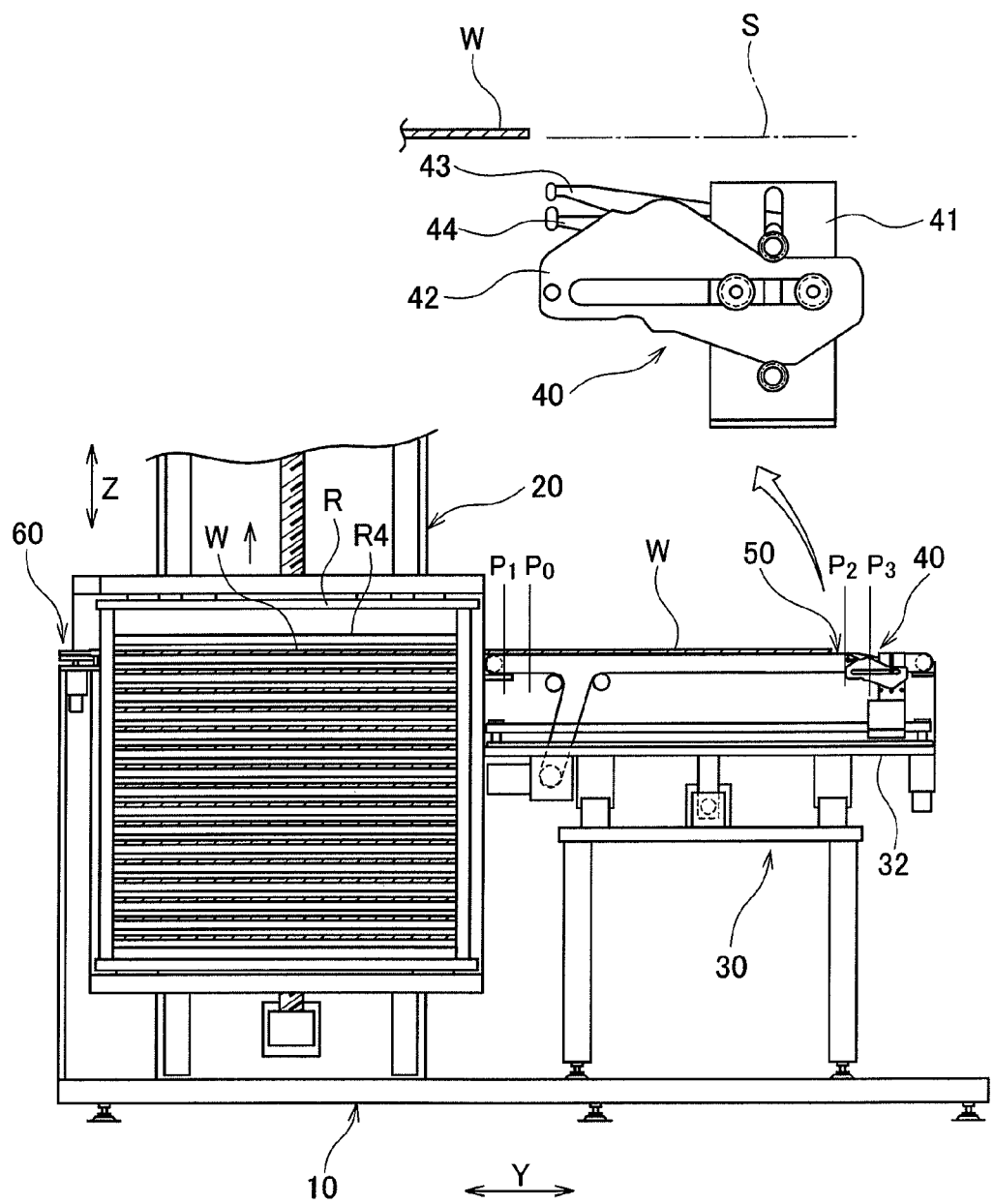
FIG. 15 is an operation view showing an operation for retracting the pull-out unit to the lower side from the carrying surface after releasing the component in the component transfer device according to the present invention.

Subsequently, as shown in FIG. 15, based on the cam function of the cam member 42, the upper arm member 43 and the lower arm member 44 move down by a predetermined distance from the carrying surface S while the movable holder 41 further moves rightward to reach a retracted position $P_3$, thereby completing a retracting operation. Furthermore, the elevation unit 20 moves up one step to position the next component W on the carrying surface S located at the predetermined height.

As described above, since the upper arm member 43 and the lower arm member 44 pull out the component W and then the upper arm member 43 and the lower arm member 44 are retracted to the lower side from the carrying surface S based on the cam function of the cam member 42, the component W can be more smoothly transferred, and the grasping operation, the pull-out operation, the releasing operation, and the retracting operation can be assuredly performed at optimum timings in the mentioned order.

Figure 16:
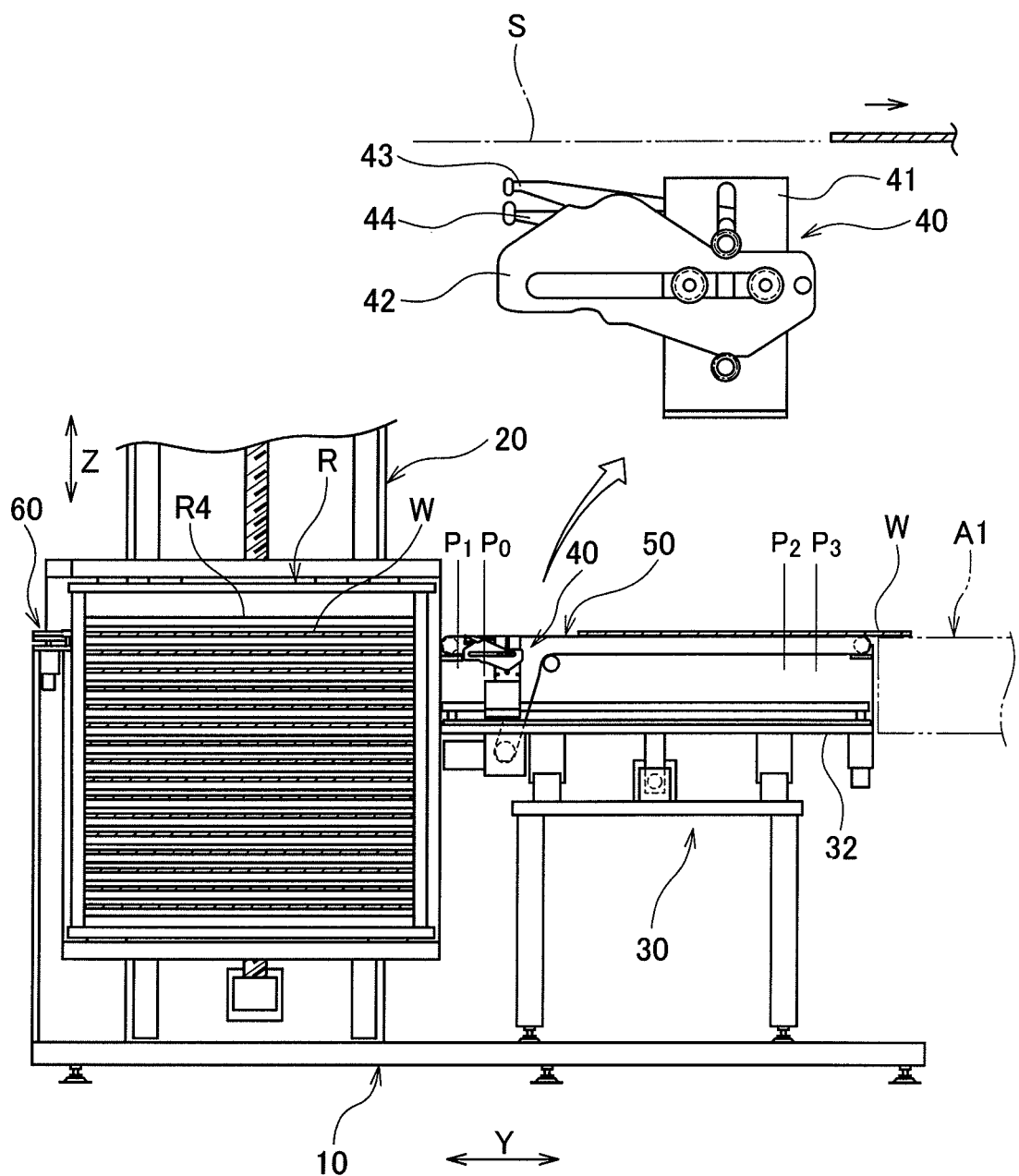
FIG. 16 is an operation view showing an operation for carrying the component toward a downstream side by a carrying unit and an operation for positioning the next component on the carrying surface in the component transfer device according to the present invention.

Then, as shown in FIG. 16, the pulled-out component W is supported by the carrying unit 50 and then carried to the supply area A1 (the carrying step). Alternatively, the pulled-out component W is supported on the carrying unit 50 and then carried to a predetermined receiving position in the supply area A1 by the carrying unit 50. Here, the carrying operation of the carrying unit 50 is performed at a desired optimum timing.

Further, the movable holder 41 moves leftward to reach the standby position $P_0$ during carriage of the component W performed by the carrying unit 50.

A series of operations including the elevation step (the elevating operation and the positioning operation), the push-out step (the push-out operation), the pull-out step (the grasping operation, the pull-out operation, the release operation, and the retracting operation), the carrying step (the carrying operation), and others are repeatedly carried out with respect to all the components W in the mentioned order.

As described above, according to the component transfer device and method, the component W such as a substrate accommodated in, e.g., the rack R can be taken out and smoothly transferred to the predetermined supply area A1 while achieving simplification of the configuration, miniaturization, a reduction in cost, and others, thereby improving the operation efficiency and the productivity as a whole.

In the foregoing embodiment, the example where the elevation unit 20 that moves up and down the rack R to be positioned is included as the holding mechanism has been described, but the present invention is not restricted thereto, and a stage that allows the component W to be positioned and held on the carrying surface located at the predetermined height by just directly mounting it thereon or an elevation table that moves up and down to position the component W on the carrying surface located at the predetermined height when directly mounting it thereon may be adopted.

In the foregoing embodiment, the configuration including the grasping member formed of the cam member 42 that reciprocates in the pull-out direction (the Y direction) to exercise the cam function in the vertical direction Z and the two arm members 43 and 44 as the pull-out unit 40 has been described, but the present invention is not restricted thereto, a discoid cam or the like that rotates to exercise the cam function may be adopted as long as it allows the grasping member to perform the grasping operation and the release operation based on the cam function, or a flexible grasping member having two fingertip pieces integrally formed to allow the elastic deformation may be adopted as long as it separably grasps the component W from the vertical direction Z.

In the foregoing embodiment, the example where the end-face cam having the upper cam portion 42b and the lower cam portion 42c defined by the upper edge and the lower edge is adopted as the cam member has been explained, but the present invention is not restricted thereto, a groove cam having a cam groove into which the upper follower pin 43b and the lower follower pin 44b are inserted may be adopted. In this case, since the upper follower pin 43b and the lower follower pin 44b can be constantly engaged with the cam groove, the extension spring 48 can be eliminated.

As described above, according to the component transfer device and method of the present invention, since a component such as a substrate accommodated in, e.g., a rack can be taken out to be smoothly transferred to a predetermined supply area and the operation efficiency and the productivity can be improved while achieving simplification of a configuration, miniaturization, a reduction in cost, and others, the device and the method can be of course utilized in a production line that mechanical components are transferred, and they are also useful in, e.g., a transfer line or a production line that components in any other field are transferred.

The invention claimed is:

1. A component transfer device comprising:
a holding mechanism for positioning and holding a component on a carrying surface located at a predetermined height; and
a pull-out unit for pulling out the component, held by the holding mechanism, in a horizontal direction,
wherein the pull-out unit includes a grasping member configured to separably grasp the component from an opposite direction, a cam member for exercising a cam function with respect to the grasping member to effect a grasping operation of the component and a releasing operation of the component at predetermined timings, and a driving mechanism for driving the cam member and the grasping member,
the holding mechanism includes an elevation unit for moving up and down a rack that accommodates the components on a plurality of stages, the grasping member includes a first arm member having a first contact portion capable of separably coming into contact with one side surface of the component, and a second arm member having a second contact portion capable of separably coming into contact with another side surface of the component,
the cam member includes a guided portion that is guided reciprocatably in a pull-out direction of the component, a first cam portion that exercises the cam function with respect to the first arm member, and a second cam portion that exercises the cam function with respect to the second arm member, and
the driving mechanism includes a movable holder that reciprocates in the pull-out direction, the movable holder having a horizontal guide portion for guiding the guided portion in the pull-out direction and another guide portion for guiding the first arm member and the second arm member in the opposite direction
wherein the cam member exercises the cam function with respect to the grasping member to effect a retracting operation for retracting toward a lower side from the carrying surface.

2. A component transfer device according to claim 1, wherein
the first arm member has a first follower portion that is guided by the another guide portion and engages with the first cam portion,
the second arm member has a second follower portion that is guided by the another guide portion and engages with the second cam portion, and
an extension spring that attracts the first follower portion and the second follower portion to each other is hooked on the first follower portion and the second follower portion.

3. The component transfer device according to claim 1, further comprising a carrying unit that supports and carries the component pulled out by the pull-out unit.

4. A component transfer device comprising:
a holding mechanism for positioning and holding a component on a carrying surface located at a predetermined height; and
a pull-out unit for pulling out the component, held by the holding mechanism, in a horizontal direction,
wherein the pull-out unit includes a grasping member configured to separably grasp the component from a vertical direction, a cam member for exercising a cam function with respect to the grasping member to effect a grasping operation of the component and a releasing operation of the component at predetermined timings, and a driving mechanism for driving the cam member and the grasping member,
the holding mechanism includes an elevation unit for moving up and down a rack that accommodates the components on a plurality of stages in the vertical direction,
the grasping member includes an upper arm member having an upper contact portion capable of separably coming into contact with an upper surface of the component, and a lower arm member having a lower contact portion capable of separably coming into contact with a lower surface of the component,
the cam member includes a guided portion that is guided reciprocatably in a pull-out direction of the component, an upper cam portion that exercises the cam function of vertical movement with respect to the upper arm member, and a lower cam portion that exercises the cam function of vertical movement with respect to the lower arm member, and
the driving mechanism includes a movable holder that reciprocates in the pull-out direction, the movable holder having a horizontal guide portion for guiding the guided portion in a predetermined range in the pull-out direction, and a vertical guide portion for guiding the upper arm member and the lower arm member in a predetermined range in the vertical direction.

5. The component transfer device according to claim 4, wherein the driving mechanism further includes a first stopper that restricts a movement of the cam member alone to exercise the cam function for the grasping operation when the movable holder reaches a predetermined close position close to the rack, and a second stopper that restricts a movement of the cam member alone to exercise the cam function for the releasing operation when the movable holder reaches a predetermined separated position apart from the rack.

6. The component transfer device according to claim 4, wherein the cam member is formed so as to exercise the cam function for a retracting operation for retracting the grasping member toward the lower side from the carrying surface when the movable holder further moves in a state in which the cam member is in contact with the second stopper to be restricted.

7. A component transfer device according to claim 4, wherein:
the upper arm member has an upper follower portion that is guided by the vertical guide portion and engages with the upper cam portion;
the lower arm member has a lower follower portion that is guided by the vertical guide portion and engages with the lower cam portion; and
an extension spring that attracts the upper follower portion and the lower follower portion to each other is hooked on the upper follower portion and the lower follower portion.

* * * * *